United States Patent
Teo et al.

(10) Patent No.: US 8,716,081 B2
(45) Date of Patent: May 6, 2014

(54) CAPACITOR TOP PLATE OVER SOURCE/DRAIN TO FORM A 1T MEMORY DEVICE

(75) Inventors: Lee Wee Teo, Singapore (SG); Yong Meng Lee, Singapore (SG); Zhao Lun, Singapore (SG); Chung Woh Lai, Singapore (SG); Shyue Seng Tan, Singapore (SG); Jeffrey Chee, Singapore (SG); Shailendra Mishra, Singapore (SG); Johnny Widodo, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 1474 days.

(21) Appl. No.: 11/686,475

(22) Filed: Mar. 15, 2007

(65) Prior Publication Data

US 2008/0224228 A1 Sep. 18, 2008

(51) Int. Cl.
*H01L 29/76* (2006.01)
(52) U.S. Cl.
USPC .................................. 438/210; 438/197
(58) Field of Classification Search
CPC ................. H01L 27/11; H01L 29/76
USPC ................... 257/379; 438/197, 210
See application file for complete search history.

(56) References Cited

U.S. PATENT DOCUMENTS

| | | | |
|---|---|---|---|
| 4,894,693 A * | 1/1990 | Tigelaar et al. ............... 257/311 |
| 5,382,807 A | 1/1995 | Tsutsumi et al. | |
| 5,492,853 A | 2/1996 | Jeng et al. | |
| 5,814,867 A | 9/1998 | Saito | |
| 5,894,163 A * | 4/1999 | McFarland et al. ........... 257/532 |
| 6,177,697 B1 * | 1/2001 | Cunningham ................ 257/301 |
| 6,307,251 B1 | 10/2001 | Sekikawa et al. | |
| 6,483,139 B1 * | 11/2002 | Arimoto et al. ............... 257/296 |
| 6,670,236 B2 | 12/2003 | Sekikawa et al. | |
| 6,787,836 B2 | 9/2004 | Clevenger et al. | |
| 6,790,724 B1 | 9/2004 | Chin et al. | |
| 7,447,064 B1 * | 11/2008 | Bu et al. .................... 365/185.01 |
| 7,465,639 B1 * | 12/2008 | Pelella et al. .................. 438/384 |
| 2001/0054727 A1 * | 12/2001 | Hofmann et al. ............. 257/296 |
| 2002/0094611 A1 * | 7/2002 | Wu et al. ........................ 438/131 |
| 2003/0001181 A1 * | 1/2003 | Leung et al. .................. 257/296 |
| 2004/0155298 A1 * | 8/2004 | Bhattacharyya ............... 257/378 |
| 2005/0009271 A1 | 1/2005 | Chin et al. | |
| 2005/0098905 A1 | 5/2005 | Lee et al. | |
| 2007/0080387 A1 * | 4/2007 | Liu et al. ........................ 257/303 |

* cited by examiner

*Primary Examiner* — Kimberly Rizkallah
*Assistant Examiner* — Duy T Nguyen
(74) *Attorney, Agent, or Firm* — Horizon IP Pte. Ltd.

(57) ABSTRACT

A method and structure for a memory device, such as a 1T-SRAM, having a capacitor top plate directly over a doped bottom plate region. An example device comprises the following. An isolation film formed as to surround an active area on a substrate. A gate dielectric and gate electrode formed over a portion of the active area. A source element and a drain element in the substrate adjacent to the gate electrode. The drain element is comprised of a drain region and a bottom plate region. The drain region is between the bottom plate region and the gate structure. A capacitor dielectric and a capacitor top plate are over at least portions of the bottom plate region.

29 Claims, 9 Drawing Sheets

CAPACITOR TOP PLATE OVER SOURCE/DRAIN TO FORM A 1T MEMORY DEVICE

BACKGROUND OF INVENTION

1) Field of the Invention

This invention relates generally to the structure and fabrication of a semiconductor device having a capacitor element and more particularly to a structure and method of forming a memory device, such as a 1T-SRAM.

2) Description of the Prior Art

As semiconductors having deep sub-micron features are fabricated, overall dimension of integrated circuit devices shrinks correspondingly. In the case of memory devices, overall dimension of each memory cell is also reduced. With the development of high tech electronic products (for example, computers, mobile phones, digital cameras or personal digital assistants), the amount of data that needs to be stored and process increases considerably. To meet the memory capacity demanded by these information technology products, smaller and higher quality integrated memory devices has to be developed.

Random access memory (RAM) is a type of volatile memory which has many applications in information technology products. In general, random access memory can be classified into static random access memory (SRAM) and dynamic random access memory (DRAM).

In each SRAM cell, digital data is stored as the conductive state of a transistor. Hence, a conventional SRAM cell consists of either a set of four transistors and two resistors (4T2R configuration) or a set of six transistors (6T configuration). On the other hand, digital data is stored as the charging state of a capacitor inside each DRAM cell. Accordingly, a conventional DRAM cell consists of a transistor and a capacitor (including a stacked capacitor or a deep trench capacitor).

In general, SRAM has a faster data processing speed and is possible to integrated with a complementary metal-oxide-semiconductor (CMOS) fabrication process. In other words, the process for manufacturing SRAM is simpler. However, one major drawback of incorporating SRAM is that area occupied by each cell is considerably larger (a SRAM cell with six transistors occupy an area roughly 10 to 16 times that of a DRAM cell). Yet, despite the considerable saving of area in incorporating DRAM cells, this advantage is counteracted by the complicated processes and hence the cost needed to manufacture the capacitor within each DRAM cell.

Recently, a one transistor SRAM cell (1T-SRAM) (also referred to as a pseudo-SRAM) has been developed. The 1T-SRAM uses a DRAM memory cell (1T1C configuration) to replace the SRAM cell (6T or 4T2R configuration) but is able to maintain the peripheral circuit structure of the original SRAM. Therefore, memory cell dimension is reduced and the level of integration is increased, and yet the refresh-free property and small random access cycle time of a SRAM cell can be retained. In other words, the 1T-SRAM is a potential candidate for replacing the conventional SRAM and DRAM cells.

FIG. 9 shows a schematic diagram of a 1T memory device.

Great advances have been made in the memory technology area. However, the prior art structures and methods can be improved upon.

SUMMARY OF THE INVENTION

The following presents a simplified summary in order to provide a basic understanding of some aspects of some example embodiments of the invention. This summary is not an extensive overview of the example embodiments or the invention. It is intended neither to identify key or critical elements of the invention nor to delineate the scope of the invention. Rather, the primary purpose of the summary is to present some example non-limiting concepts in a simplified form as a prelude to the more detailed description that is presented later.

An example embodiment of the present invention provide a structure and a method of manufacturing a memory device which is characterized as follows:

forming an isolation region surrounding an active region on semiconductor substrate;

forming a first transistor over an first active region; the first transistor comprised of gate structure, a source element, and a drain element; the source element and drain element are adjacent the gate structure; the source element and drain element are doped with same conductivity type impurity;

the drain element is comprised of a drain region and a bottom plate region; the drain region is adjacent to the gate structure and the drain region is between the gate structure and the bottom plate region;

forming a capacitor dielectric layer over the bottom plate region and forming a top plate over the capacitor dielectric layer; the top plate has top plate sidewalls;

whereby a memory device is comprised of the source element that acts as a bitline, the bottom plate region that acts as a bottom capacitor plate; the capacitor dielectric layer that acts as a capacitor dielectric; the top plate that act as a top capacitor plate.

An exemplary embodiment of a semiconductor device having a capacitance element is comprised of:

an isolation film surrounding an first active area on a substrate;

a gate dielectric and gate electrode over a portion of the active area;

a source element and a drain element in the substrate adjacent to the gate electrode; the drain element is comprised of a drain region and a bottom plate region; the bottom plate region is adjacent to the drain region and the isolation film;

a capacitor dielectric and a capacitor top plate over at least the bottom plate region;

whereby a 1T memory device is comprised of the source element that acts as a bitline, the gate electrode is connected to a word line; the bottom plate region that acts as a bottom capacitor plate; the capacitor dielectric layer that acts as a capacitor dielectric; the top plate that act as a top capacitor plate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A-7B show example PFET devices.

DETAILED DESCRIPTION OF THE EXAMPLE EMBODIMENTS

The example embodiments provide a structure and method of forming a memory device such as a one transistor Static Random Access Memory (1T SRAM).

The example embodiments of the present invention will be described in detail with reference to the accompanying drawings. The figures may not be to scale.

Figure 7A:
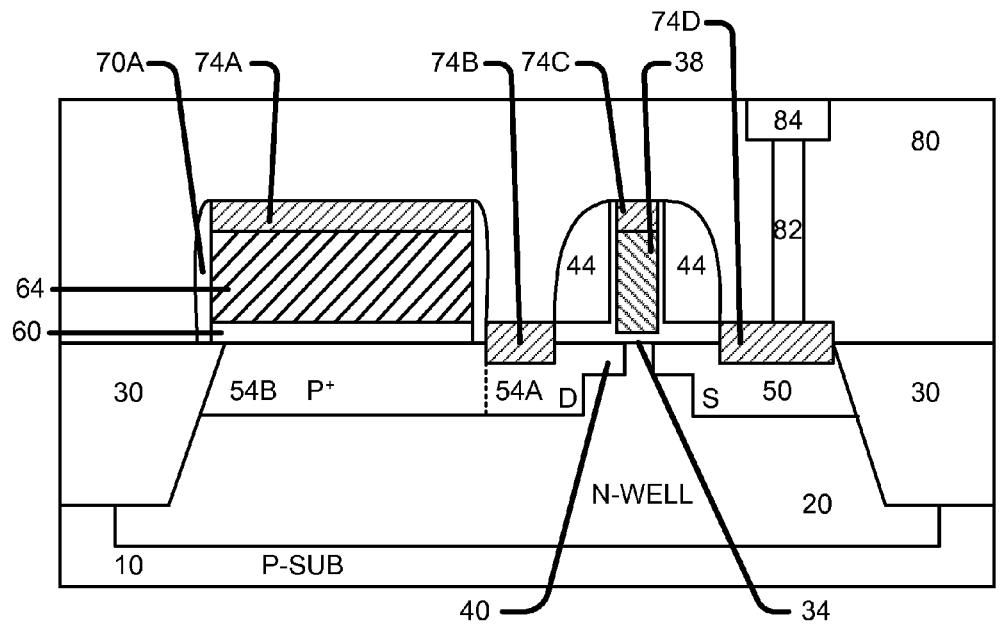
Figure 8A:
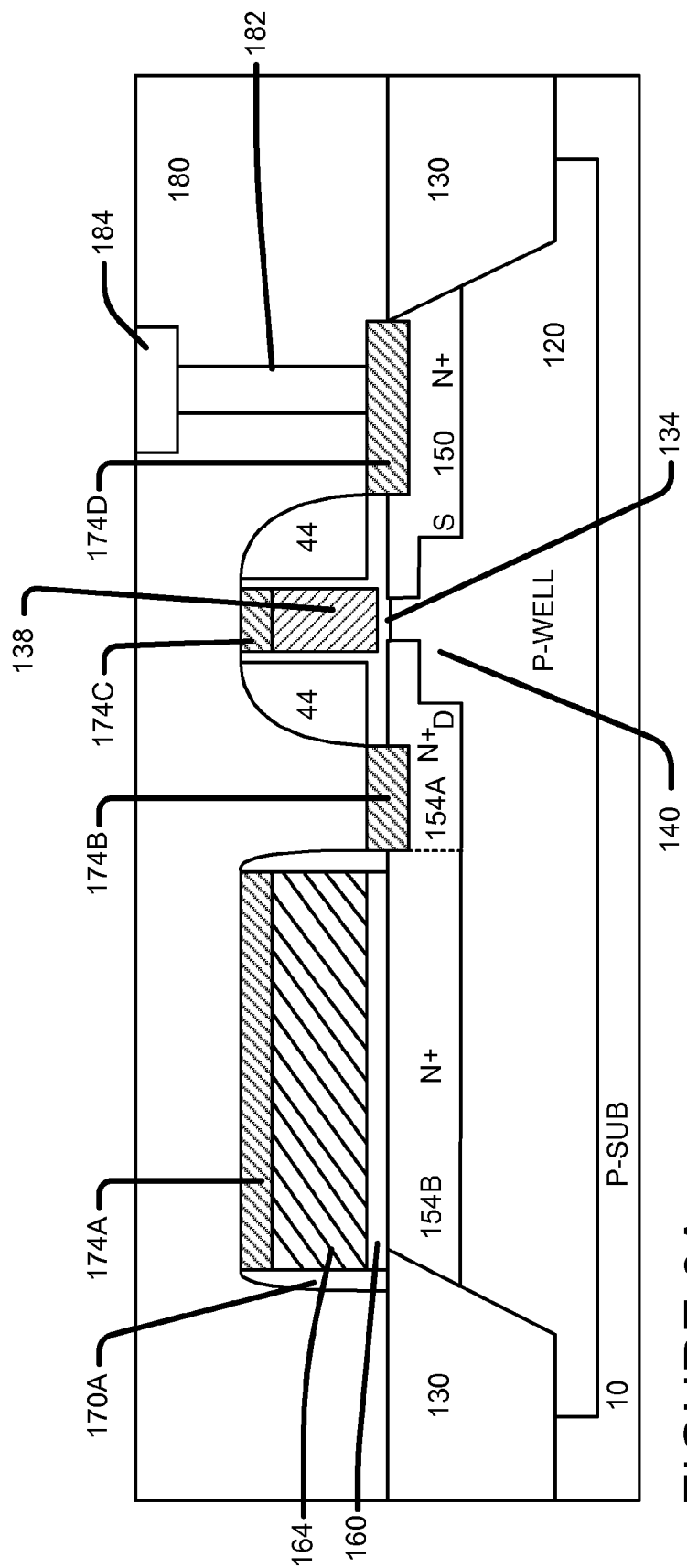
FIG. 8A is a cross sectional view for illustrating a structure and method for manufacturing a memory device comprised of a NFET in a P-well as part of a two well CMOS approach according to an example embodiment of the present invention.

Referring to FIG. 8A, an example completed memory device (e.g., 1T SRAM or DRAM) is shown. A point of the some example embodiments is that the (FIG. 7A) capacitor top plate 64 is over a doped bottom plate region 54B (a portion of the drain element 54A 54B).

Below an example SRAM is shown as a NFET. It should be understood that the embodiment is also applicable to NFET or/and PFET type devices. Also, both NFET and PFETs based 1T memory devices (e.g., SRAMs) can be formed concurrently on the same chip.

A. Form a FET on Active Region

Figure 1A:
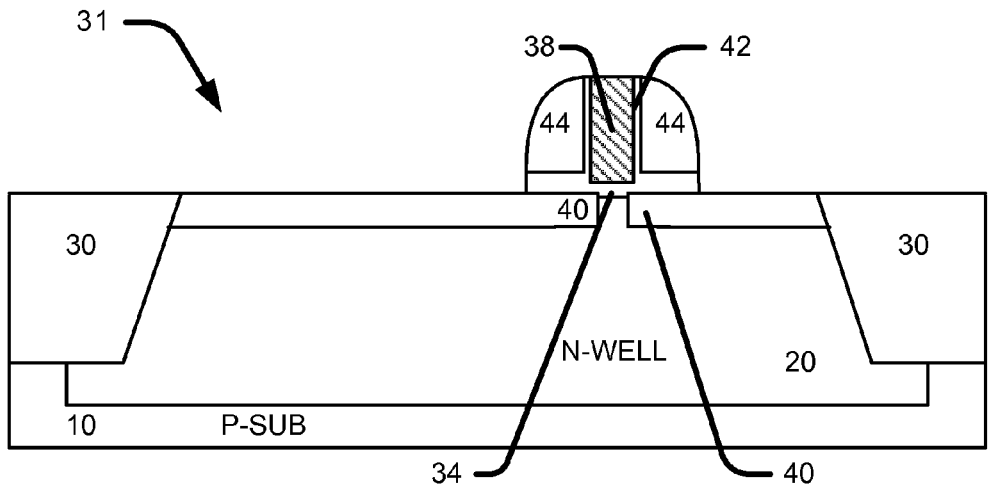
FIGS. 1A, 1B, 2, 3, 4, 5, 6, 7A and 7B are cross sectional views for illustrating a structure and method for manufacturing a memory device according to an example embodiment of the present invention.

Referring to FIG. 1A, we may form an isolation region(s) 30 surrounding an active region 31 on semiconductor substrate 10.

The active region 31 is near the surface where the FET will be formed is doped with a first conductivity type dopant, which for a PFET is n-type. In this example, a n-well 20 is formed.

The isolation regions can be shallow trench isolation (STI) regions comprised of oxide.

An example method of forming an example PMOS FET is as follows. Other configurations of the FET (e.g., logic transistors) are possible. The impurity types can be reversed to form a NFET using similar steps. Also, both PMOS and NMOS devices can be form concurrently.

We form a gate dielectric layer and a conductive gate layer over the substrate. The substrate can be a monocrystaline Si substrate or any suitable semiconductor substrate or structure. The gate dielectric layer can be comprised of any suitable dielectric such as silicon oxide. The conductive gate layer can be comprised of polysilicon, silicide and/or metals.

We pattern the gate dielectric layer and gate layer to form gate dielectric 34 and gate electrode 38.

We can implant p-type dopants to form LDD regions or source-drain extensions (SDE) 40 adjacent to the gate electrode 38. The SDE 40 can have a boron or any p type impurity. The SDE 40 can have a dopant concentration between 1E20 and 1E22 atoms/cc.

We can form gate spacers on the sidewalls of the gate electrode 38. The gate spacers can be comprised of one or more layers. In this example the first L spacer 42 can be comprised of oxide. The second spacer 44 can be comprised of nitride.

B. Form Source/Drain

Figure 1B:
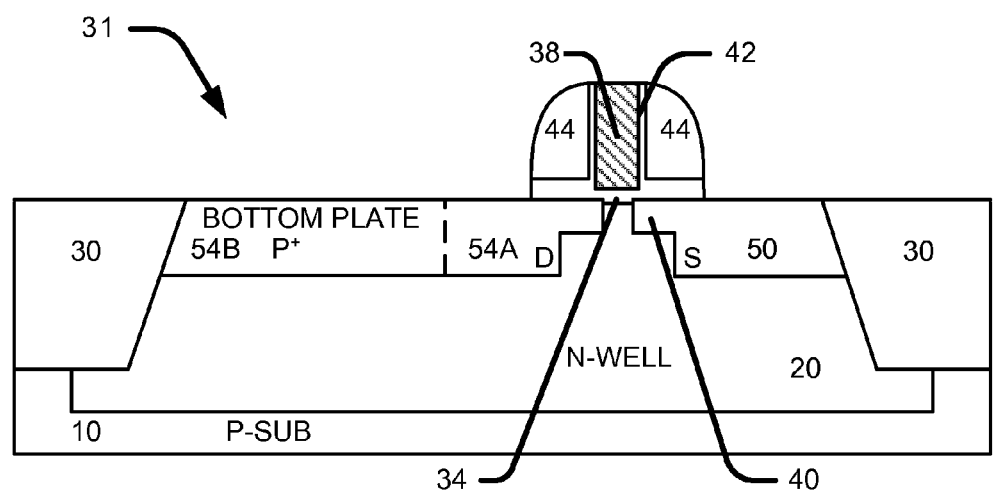

Referring to FIG. 1B, next, we can implant p-type impurities into the substrate to form source element 50 and drain element 54A 54B. We can use the gate structure and the isolation regions are implant masks. If other devices are being formed on other areas of the substrate, a resist layer can be used to demark the appropriate areas for the implant. The source element and drain region are formed from the same conductivity type impurity. The source element 50 and drain element 54A 54B can be formed using the same implant step.

A feature of the embodiment is that the drain element is comprised of a bottom plate region that is extended or enlarged much more than a typical drain region.

The drain element 54A 54B may be comprised of two sections or regions:
  (1) a drain region 54A that is adjacent to the gate electrode 38 and
  (2) an bottom plate region 54B (extended drain region 54B) that is between the drain region 54A and the isolation region 30.

The bottom plate region 54B (or extended drain region) will act as the bottom plate of a subsequently formed capacitor.

The dopant profile of the extended drain region 54B (under the capacitor) is preferably substantially the same as the source 50 or drain region 54A.

The area of the extended drain region 54B is preferably about 2 to 100 times larger than the area of a conventional drain (or of drain region 54A which does not have a capacitor top plate formed thereover).

The source element 50, drain region 54A and extended drain region 54B can be formed from the same implant step.

The drain region 54A and a bottom plate region 54B preferably have substantially the same concentration and depth.

The source element 50, drain region 54A and extended drain region 54B can be have a B, BF2 or any suitable p type dopant, and may have a dopant concentration between about 1E20 and 1E22 atom/cc; and may have depth between 20 nm and 90 nm.

The implant process can comprise: implanting B ions at an energy between 5 keV and 30 keV at a dose between 1E14 and 5E15 atoms/square cm.

Compared to the drain region 54A, the area of plate region 54B can be between 200% and 10000% (2× and 100×) as large.

C. Form a Dielectric Layer and a Conductive Layer

Figure 2:
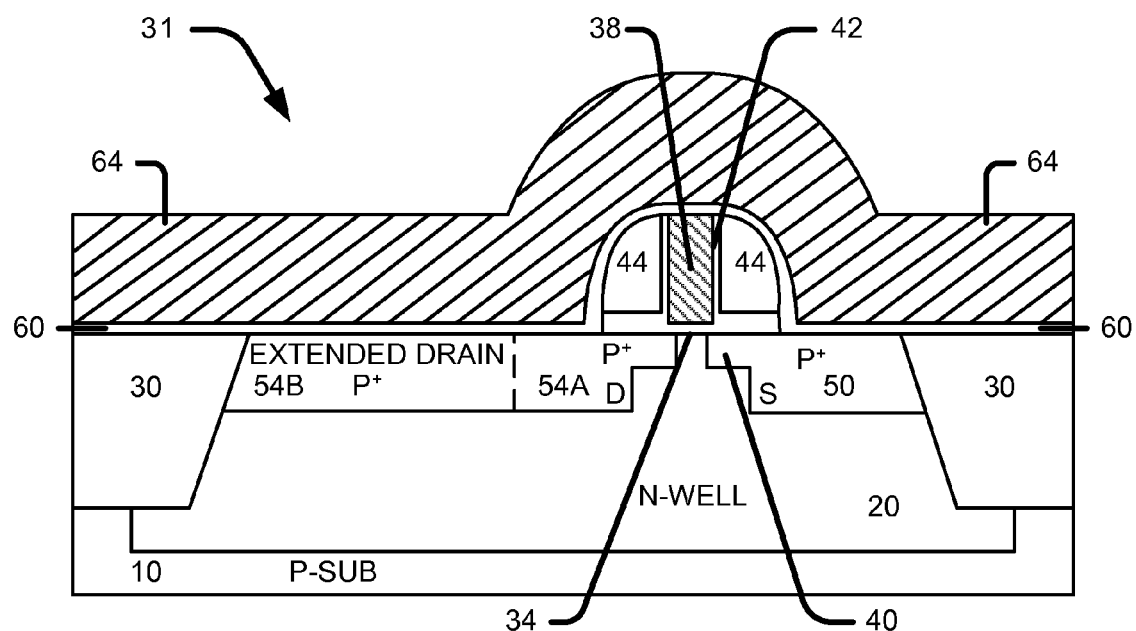

Referring to FIG. 2, we can form a (capacitor) dielectric layer 60 and a conductive layer 64 over the substrate surface.

The dielectric layer 60 can be comprised of high-k dielectric (K>3), oxy-nitride or oxide and is preferably comprised of oxide. The dielectric layer can have a thickness between 10 and 500 angstroms.

The conductive layer 64 may be comprised of polysilicon, silicon, silicide and is preferably comprised of polysilicon. The conductive layer 64 can have a thickness between 500 and 2000 angstroms.

A conductive layer 64 comprised of polysilicon can be doped with (n or p type impurities depending on the type of FET being formed). For PMOS FET, the conductive layer 64 is preferably doped with p at a concentration between 1E20 and 5E22 atoms/cc.

For capacitor plate dopant concentration, normally the higher the concentration the better the conduction of the plate.

Figure 3:
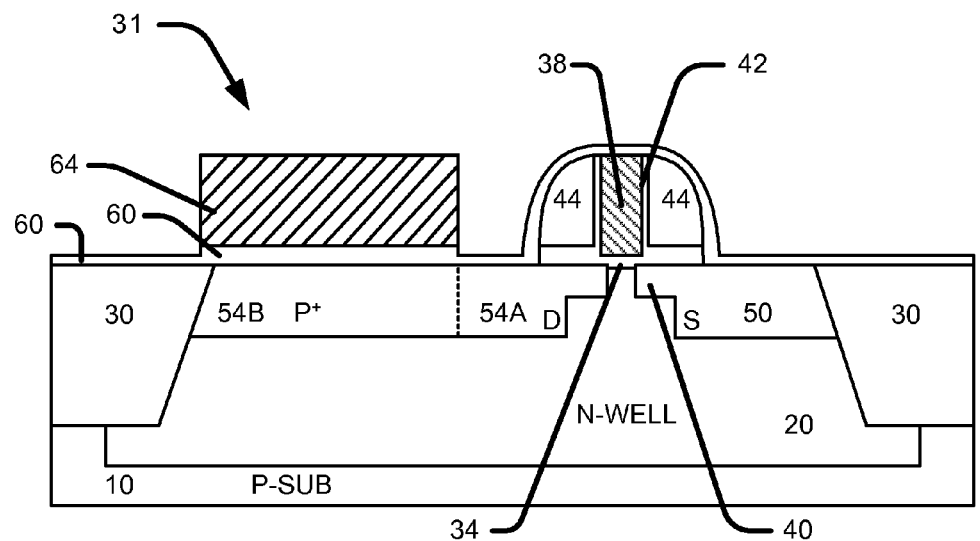

D. Form a Top Plate and Capacitor Dielectric Layer Over the Extended Drain Region Referring to FIG. 3, we can pattern the conductive layer 64 and the dielectric layer 60 to form a top plate 64 and capacitor dielectric layer 60 over at least a portion of the extended drain region (bottom plate region) 54B. Preferably the top plate is over substantially all of the bottom plate region 54B. The top plate 64 has sidewalls.

Some remnants of the dielectric layer 60 may remain on the other surfaces. These remnants may be removed.

E. Form Top Plate Spacers

We can form top plate spacers 70A over the sidewalls of the top plate 64.

Figure 4:
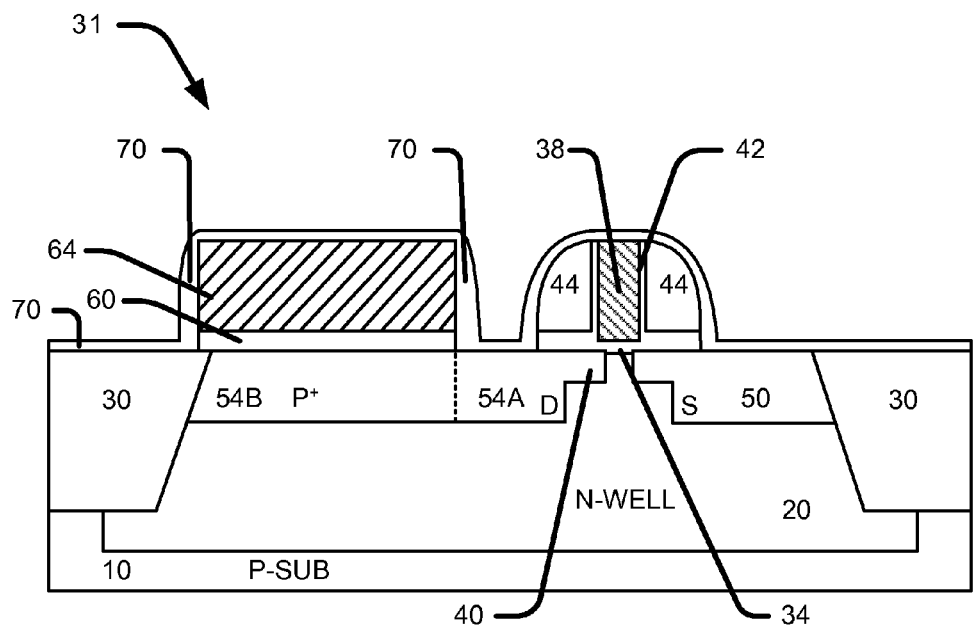

Referring to FIG. 4, we form a spacer layer 70 over the top plate 64 and sidewalls of the top plate. We can use a SPA process that is low temperature oxidation step.

The spacer layer can be comprised of oxide or nitride and is preferably comprised of oxide. The spacer layer may substantially consist of oxide or nitride and preferably of oxide.

Figure 5:
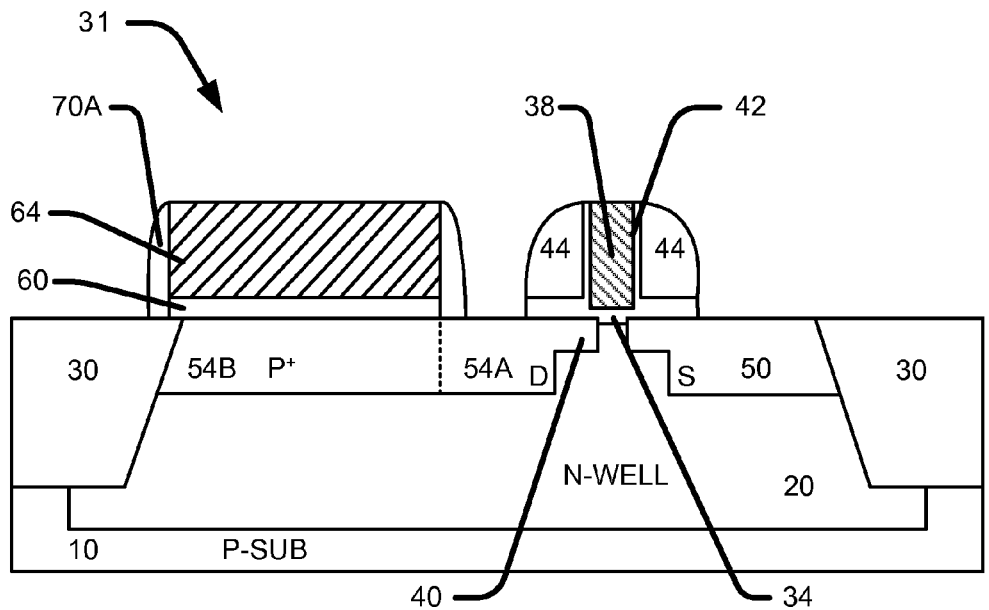

Referring to FIG. 5, we etch the spacer layer 70 to form top plate spacers 70A on sidewalls of the top plate 64. The etch can remove the remnants of the dielectric layer that could remain of the other surfaces.

F. Form Silicide Regions

Figure 6:
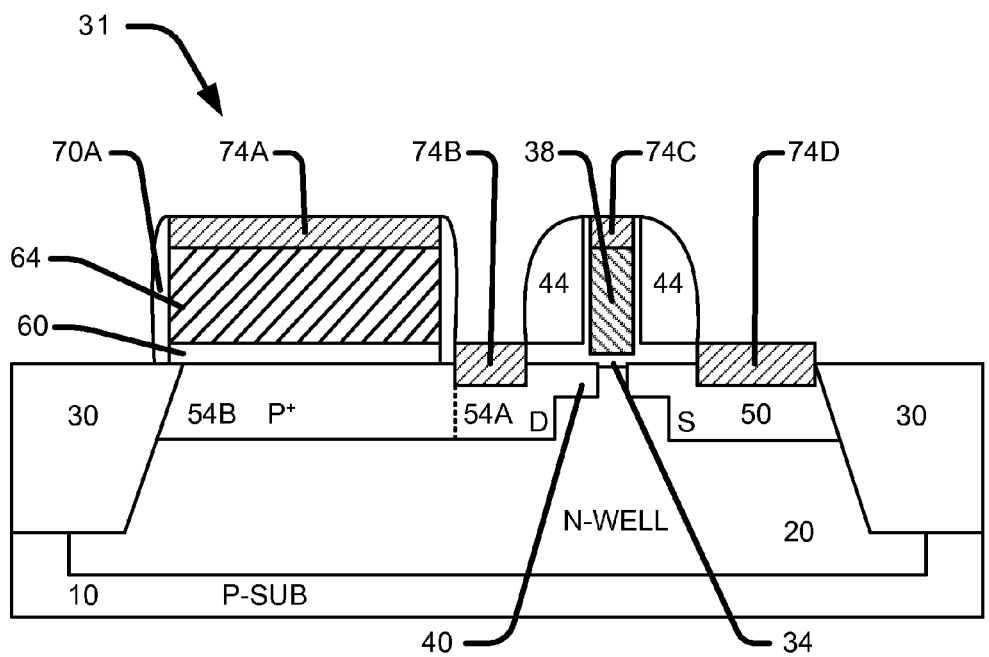

Referring to FIG. 6, we can form silicide regions 74A 74B 74C and 74D on the top plate 64, the drain region 74B, the source element 50 and the gate electrode 74C. The silicide regions may be: the top plate silicide 74A, drain region silicide 74B gate silicide 74C and source region silicide 74D. The silicide regions can be formed by depositing a suitable metal layer over the surface and annealing.

G. BEOL Processing

Referring to FIG. 7A, we may form an interlevel dielectric layer (ILD) 80 over the substrate. The ILD layer 80 can be comprised of oxide. We may form interconnects 82 84 thru the interlevel dielectric layer 80 to the devices. Additional levels of interconnects and dielectric layers may be formed. Additional process may be performed.

H. 1T Memory Device Components

Figure 7B:
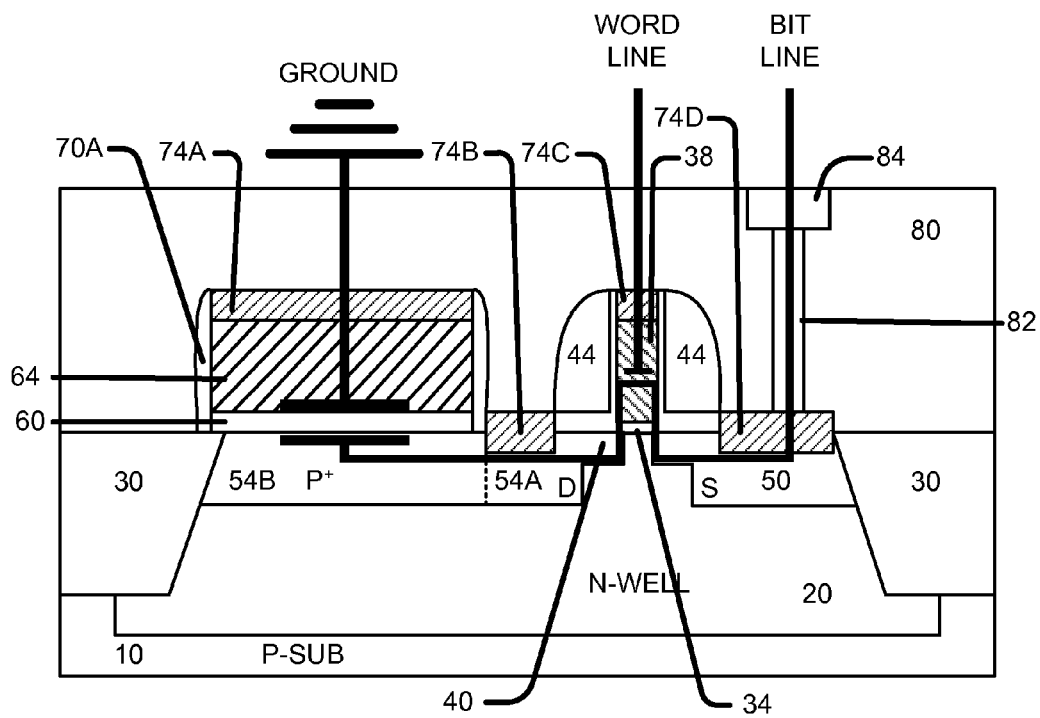

FIG. 7B shows an electrical schematic overlaid on the embodiment's memory device (such as a SRAM).

A memory device (e.g., 1T SRAM) can be comprised of:
the source element 50 acts as a bitline,
the gate electrode 74C is connected to a word line (FIG. 7C-88);
the bottom plate 54B (e.g. extended drain) acts as a bottom capacitor plate;
the drain region 54 a acts as the drain;
the capacitor dielectric layer 60 acts as a capacitor dielectric;
the top plate 64 act as a top capacitor plate.

Figure 7C:
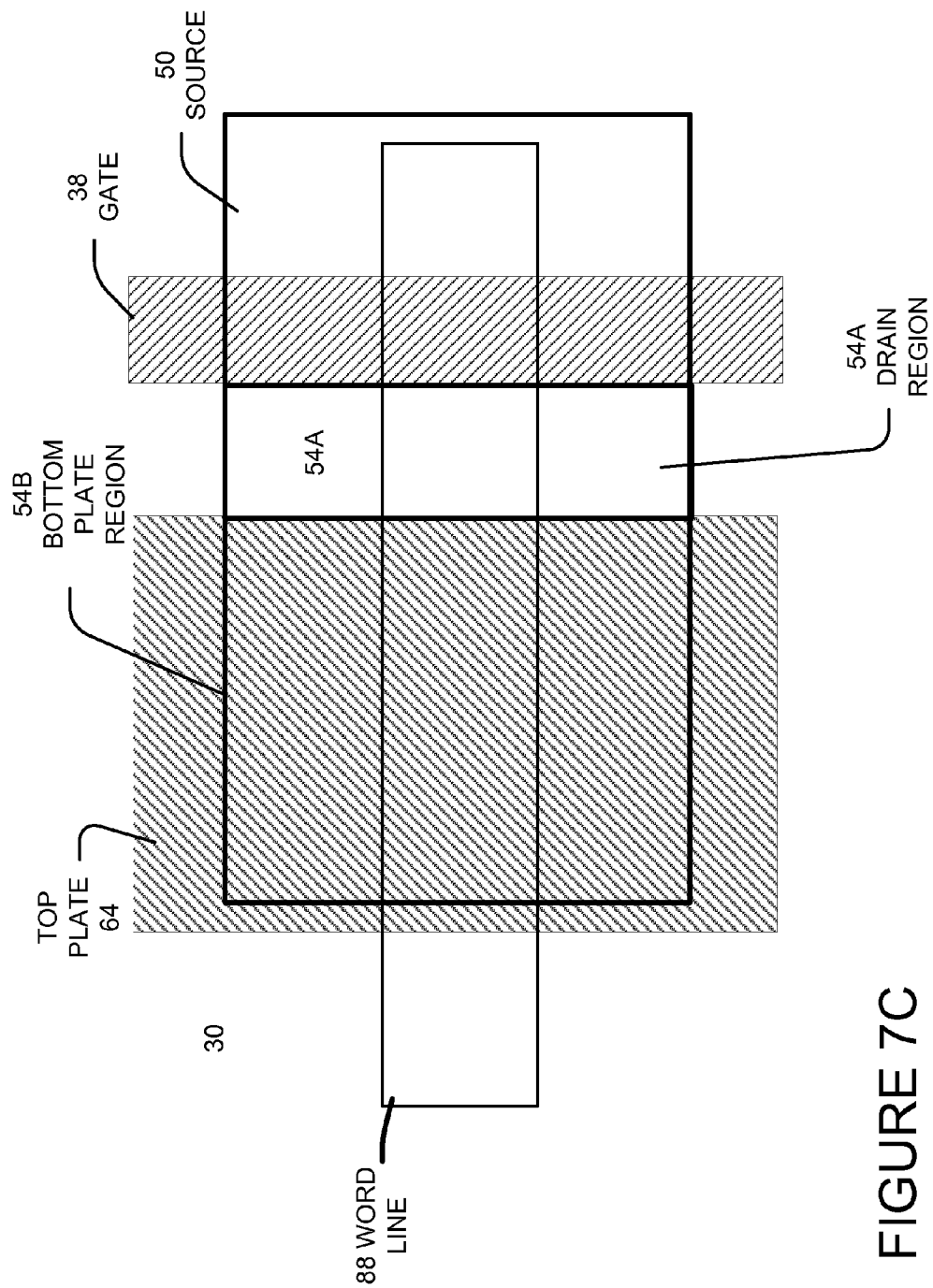
FIG. 7C is a top down view illustrating a structure and method for manufacturing a memory device according to an example embodiment of the present invention.

FIG. 7C shows a top down view of the device shown in FIGS. 7A and 7B. FIG. 7C shows word line 88.

I. Completed Memory Device

Referring to FIG. 8A, an example completed memory device (e.g., 1T SRAM) is shown. A point of the embodiment is that the (FIG. 7A) capacitor top plate 64 is over a portion of the drain element 54A 54B (e.g., bottom plate region 54B).

Some example embodiments with the top plate 64 over the extended drain 54B can have non-limiting features of:
the approach is self-aligned where the gate is self aligned to the drain of the transistor
No additional implant step required to form the bottom plate region
reduce the overall resistance in the circuit because of the bottom plate region 54B is doped reduces the resistance
double poly approach (e.g., 38 and 64) allows the used of deposition dielectric (i.e, high k materials)
Smaller dimension of embodiment's memory device (e.g., 1T SRAM) thus greater packing density.
The embodiments memory device has a minimum spacing between the Gate and the top plate because the drain region is connected to the bottom plate region. (e.g., no undoped region between the drain region 54A and the bottom plate region 56B.
Enables both p and N type 1T memory devices with double well schemes J. Double Well Embodiment FIG. 8A shows an embodiment with NFET memory device (e.g. 1T SRAM) with a double well. For example, this NFET 1T SRAM (FIG. 8A) can be formed on the same chip with the PFET 1T SRAM (shown in FIG. 7A). Both PFET and NFET memory device can be formed simultaneously on the same chip.

For the NFET 1T SRAM in FIG. 8A, since the drain 154A is connected to the bottom plate 154B of the capacitor, the capacitor is isolated to the substrate by a PN junction. This prevents any leakages to the substrate. Allows formation of both P and N type 1T SRAM on same chip using double wells. Without the embodiment's PFET bottom plate (extended drain) 154B, a triple well would be required to prevent shorting of the capacitor to the substrate.

Example NFET concentrations ranges are listed in the table below.

| Region Low | Low conc Atom/cc | High conc Atom/cc |
|---|---|---|
| p-well 120 | 1E16 | 5E21 |
| Drain 154A Bottom plate region 154B (n-type) | 1E18 | 5E22 |
| Source 150 (n-type) | 1E18 | 5E22 |
| TOP Plate 164 (doped with N-typed dopant) | 1E20 | 5E22 |

FIG. 8A shows: gate 138, silicide regions 174A 174B 174C and 174C, ILD layer 180, contact 182, and interconnect 184

K. Triple Well CMOS Embodiment

Figure 8B:
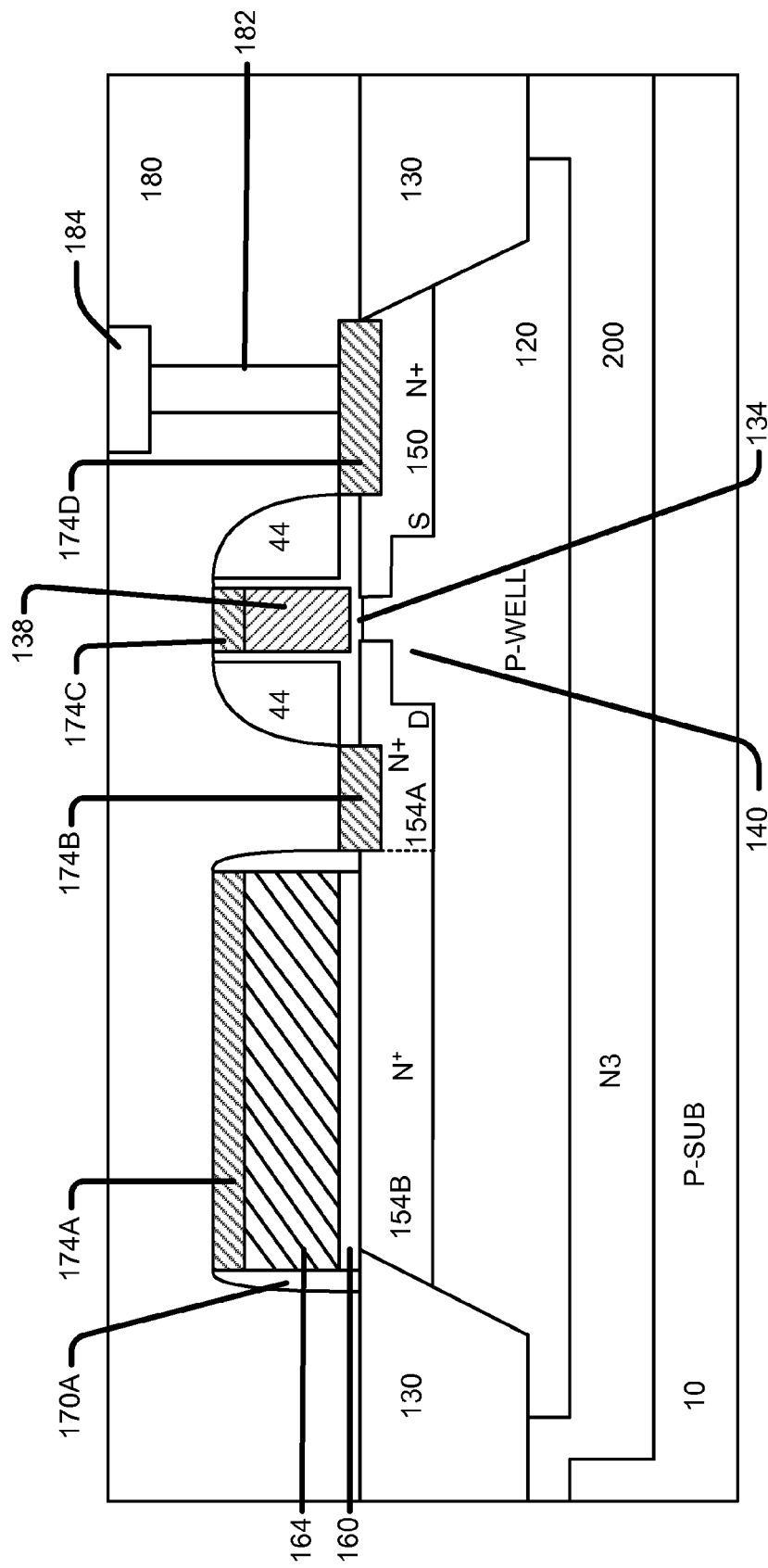
FIG. 8B is a cross sectional view for illustrating a structure and method for manufacturing a memory device comprised of a NFET in a P-well as part of a Triple well CMOS approach according to an example embodiment of the present invention.
Figure 9:
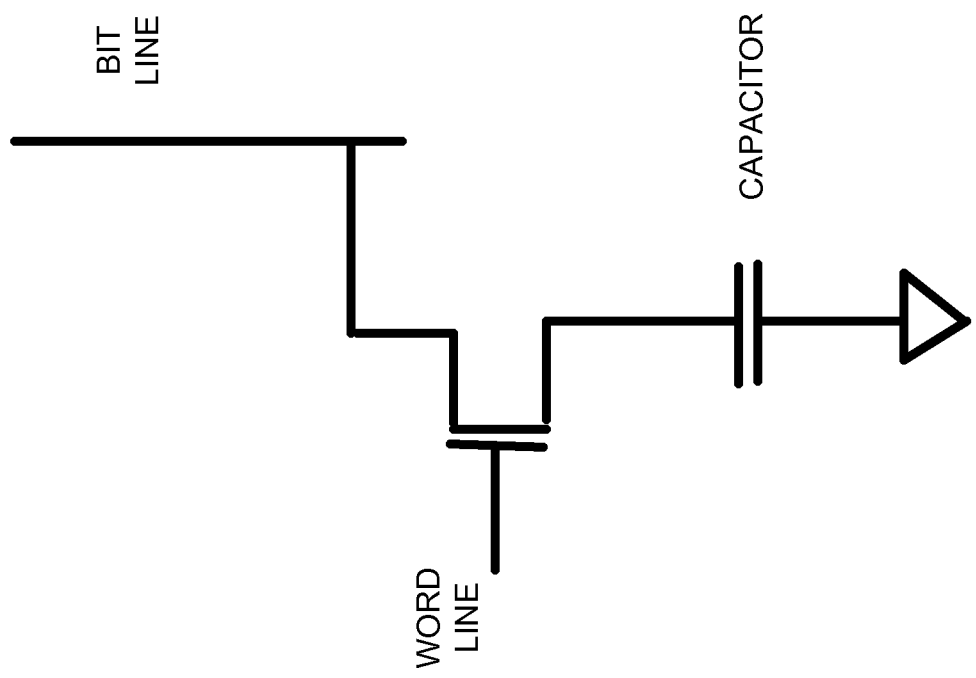
FIG. 9 is a schematic diagram of a 1T memory device according to the prior art.

FIG. 8B shows an embodiment of a NFET 1T SRAM in a triple well process. The NFET 1T SRAM can be formed on the same chip as the FIG. 7A PFET 1T SRAM. The thee wells could the be (1) Nwell 20(-FIG. 7A) (2) Pwell 120 (FIG. 8B), (3) $3^{rd}$ well (N3) 200 (FIG. 8B).

The third well 200 purpose is to further isolate the p-well 120 from the p-substrate 10. However, this triple well embodiment is not required to form both NFET and PFET 1T SRAMs. The second embodiment (FIGS. 7B and 8A) with the double wells can be used to form both NFET and PFET 1T SRAMs. Using the third well 200 is an optional aspect.

L. Non-Limiting Example Embodiments

The example embodiments of the invention can be used to make memory devices such as 1T SRAM's and 1T DRAMs. For a DRAM device, the area of the capacitor may need to be increased (compared to a SRAM) to increase the capacitance of the DRAM.

The example embodiment are not limited to the order of the steps shown.

Any element that is described as being able to be comprised of a material(s), may also consist essentially of that material(s).

In the above description numerous specific details are set forth such as, thicknesses, etc., in order to provide a more thorough understanding of the example embodiments of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a memory device comprising:
    providing an active region in a substrate; and
    forming a one transistor random access memory (RAM) for storing digital data in the active region comprising
        forming a gate structure in the active region, wherein the gate structure is coupled to a word line,
        forming a source region and an extended drain region adjacent to the gate structure in said substrate, wherein
        the source region is coupled to a bit line,
        the extended drain region includes a drain region and a bottom plate of a capacitor, the drain region is adjacent to the gate structure and the bottom plate extends from the drain region to an isolation region, the drain region and the entire bottom plate of the extended drain region are formed simultaneously, wherein the drain region and bottom plate of the extended drain region have about the same dopant concentration, and
        forming a capacitor dielectric layer and a top plate of the capacitor on the bottom plate, wherein the top plate is on the capacitor dielectric layer, and wherein the top plate is coupled to ground and completely covers the bottom plate, the capacitor dielectric layer is directly on the bottom plate and partially on the isolation region.

2. The method of claim 1 which further comprises:
    the isolation region surrounds the active region;
    the top plate has top plate sidewalls;
    forming top plate spacers on the top plate sidewalls;
    forming silicide regions on the top plate, the drain region, the source region and the gate structure;
    forming an interlevel dielectric layer over the substrate;
    forming interconnects through said interlevel dielectric layer to at least said source region, and drain region.

3. The method of claim 1 wherein the capacitor dielectric layer and the top plate are formed by the steps of:
    forming a dielectric layer and a conductive layer over a substrate surface of said substrate;
    patterning said conductive layer and said dielectric layer to form the top plate and the capacitor dielectric layer over the bottom plate; and wherein
    the bottom plate acts as a bottom capacitor plate;
    the capacitor dielectric layer acts as a capacitor dielectric;
    the top plate acts as a top capacitor plate.

4. The method of claim 1 which further comprises forming a n type well in said active region; and
    the source region and extended drain region are p type.

5. The method of claim 1 which further comprises forming a P type well in said active region; and
    the source region and extended drain region are n type.

6. The method of claim 1 which further comprises forming a first p type well in said active region and forming an underlying second n type well under the first p type well; and
    the source region and extended drain region are n type.

7. The method of claim 1 wherein said source region, said drain region and said bottom plate have an impurity concentration between 1 E20 and 1 E22 atom/cc;
    said source region, said drain region and said bottom plate have substantially the same impurity concentration.

8. The method of claim 1 wherein the area of the bottom plate is between 2 and 100 times as large as the area of the drain region.

9. A method of fabrication of a memory device comprising:
    providing a substrate having an active region, wherein the active region is doped with a first conductivity type dopant;
    forming a first random access memory (RAM) transistor for storing digital data in the active region, wherein the first RAM transistor comprises
        a gate structure on the substrate having drain and source sides, and
        a source and a drain in the substrate adjacent to the source and drain sides of the gate structure, wherein the drain comprises an extended drain having a drain region and a bottom plate of a capacitor, the bottom plate extends from the drain region to an isolation region, wherein the drain region and the entire bottom plate are formed simultaneously, wherein the drain region and bottom plate of the extended drain region have about the same dopant concentration;
    forming a dielectric layer and a conductive layer over the substrate surface;
    patterning the conductive layer and the dielectric layer to form a top plate and a capacitor dielectric layer on the bottom plate, wherein the top plate is disposed completely on the bottom plate, the capacitor dielectric layer is directly on the bottom plate and partially on the isolation region, the top plate has top plate sidewalls;
    forming top plate spacers on the top plate sidewalls; and
    forming silicide regions on the top plate, the drain region, the source and the gate structure, wherein the gate structure is coupled to a word line, the source is coupled to a bit line and the top plate is coupled to ground.

10. The method of claim 9 which further comprises:
   forming an interlevel dielectric layer over the substrate; and
   forming interconnects through said interlevel dielectric layer to said first transistor, wherein
   the bottom plate acts as a bottom capacitor plate;
   the capacitor dielectric layer acts as a capacitor dielectric; and
   the top plate acts as a top capacitor plate.

11. The method of claim 9 wherein said conductive layer is comprised of a material selected from the group consisting of polysilicon, silicon, and silicide.

12. The method of claim 9 which further comprises:
   forming a spacer layer over the substrate; and
   etching said spacer layer to form top plate spacers on sidewalls of said top plate.

13. The method of claim 9 wherein said source, said drain region and said bottom plate have an impurity concentration between 1 E20 and 1 E22 atom/cc.

14. The method of claim 9 wherein the area of the bottom plate is between 2 and 100 times as large as the area of the drain region.

15. A method of fabricating a semiconductor device comprising:
   providing a substrate with a device region;
   forming a one transistor random access memory (RAM) for storing digital data in the device region comprising
      forming a gate in the device region having first and second sides and coupling the gate to a word line,
      forming first and second source/drain regions in the substrate adjacent to the first and second sides of the gate, wherein the first source/drain region includes an extended first source/drain region, the extended first source/drain region includes a first source/drain adjacent to the first side of the gate and a first capacitor plate extending from the first source/drain to an isolation region, the first source/drain region and the entire first capacitor plate of the extended first source/drain region are simultaneously formed, wherein the first source/drain region and the first capacitor plate of the extended first source/drain region have about the same dopant concentration, and
      coupling the second source/drain region to a bit line;
   forming a second capacitor plate over the first capacitor plate, the first and second capacitor plates are separated by a capacitor dielectric, wherein the second capacitor plate covers the first capacitor plate, the capacitor dielectric is directly on the first capacitor plate and partially on the isolation region; and
   coupling the second capacitor plate to ground.

16. The method of claim 15 wherein the first capacitor plate is directly adjacent to the first source/drain of the extended first source/drain region.

17. The method of claim 16 wherein the source/drain regions and first capacitor plate comprise first polarity type dopants.

18. The method of claim 17 wherein the first polarity type dopants comprise p-type dopants.

19. The method of claim 16 wherein forming the second capacitor plate over the first capacitor plate, the first and second capacitor plates are separated by the capacitor dielectric comprising:
   forming a capacitor dielectric layer and a second capacitor conductor layer over the substrate covering the gate; and
   patterning the capacitor dielectric layer and the second capacitor conductor layer to form the capacitor dielectric and the second capacitor plate.

20. The method of claim 19 wherein top surface of the second capacitor plate is a planar surface which is substantially coplanar with top surface of the gate.

21. The method of claim 16 wherein the second capacitor plate comprises sidewalls with spacers formed thereon.

22. The method of claim 15 wherein the source/drain regions and first capacitor plate comprise first polarity type dopants.

23. The method of claim 22 wherein the first polarity type dopants comprise p-type dopants.

24. The method of claim 15 wherein forming the second capacitor plate over the first capacitor plate, the first and second capacitor plates are separated by the capacitor dielectric comprising:
   forming a capacitor dielectric layer and a second capacitor conductor layer over the substrate covering the gate; and
   patterning the capacitor dielectric layer and the second capacitor conductor layer to form the capacitor dielectric and the second capacitor plate.

25. The method of claim 24 wherein top surface of the second capacitor plate is a planar surface which is substantially coplanar with top surface of the gate.

26. The method of claim 25 comprising:
   forming sidewall spacers on sidewalls of the second capacitor plate; and
   forming silicide regions on the second capacitor plate, the source/drain regions and the gate.

27. The method of claim 15 wherein the source/drain regions and first capacitor plate comprise first polarity type dopants.

28. The method of claim 27 wherein the second capacitor plate comprises sidewalls with spacers formed thereon.

29. The method of claim 27 wherein the first polarity type dopants comprise p-type dopants.

* * * * *